(12) United States Patent
Fujimoto (10) Patent No.: US 10,447,029 B2
(45) Date of Patent: Oct. 15, 2019

(54) CONNECTION CIRCUIT OF INTERCONNECT DEVICE

(71) Applicant: FANUC CORPORATION, Minamitsuru-gun, Yamanashi (JP)

(72) Inventor: Taisei Fujimoto, Yamanashi (JP)

(73) Assignee: Fanuc Corporation, Yamanashi (JP)

( * ) Notice: Subject to any disclaimer, the term of this patent is extended or adjusted under 35 U.S.C. 154(b) by 0 days.

(21) Appl. No.: 15/896,161

(22) Filed: Feb. 14, 2018

(65) Prior Publication Data

US 2018/0248358 A1   Aug. 30, 2018

(30) Foreign Application Priority Data

Feb. 27, 2017   (JP) ................. 2017-034830

(51) Int. Cl.

| H02H 7/20 | (2006.01) |
|---|---|
| H02H 3/02 | (2006.01) |
| G01R 31/02 | (2006.01) |
| H01H 85/02 | (2006.01) |
| H01H 83/02 | (2006.01) |

(52) U.S. Cl.
CPC .............. H02H 7/20 (2013.01); G01R 31/025 (2013.01); H01H 85/0241 (2013.01); H02H 3/02 (2013.01); H01H 83/02 (2013.01)

(58) Field of Classification Search
CPC ........ H02H 7/20; H02H 3/02; H01H 85/0241; H01H 83/02; G01R 31/025
USPC .......................................................... 361/52
See application file for complete search history.

(56) References Cited

U.S. PATENT DOCUMENTS

| 5,903,160 A * | 5/1999 | Ianenko ............. G01R 31/2805 |
| | | 324/537 |
| 7,030,623 B1 * | 4/2006 | Carpenter ............ G01R 31/006 |
| | | 324/522 |
| 2003/0090271 A1 * | 5/2003 | Hurwicz ............. G01R 31/3272 |
| | | 324/424 |

(Continued)

FOREIGN PATENT DOCUMENTS

| JP | S53157839 U | 12/1978 |
| JP | H10124154 A | 5/1998 |

(Continued)

OTHER PUBLICATIONS

Decision to Grant a Patent for Japanese Application No. 2017-034830, dated Jul. 17, 2018, with translation, 6 pages.

*Primary Examiner* — Zeev V Kitov
(74) *Attorney, Agent, or Firm* — RatnerPrestia (57) ABSTRACT

Disclosed is a connection circuit capable of detecting erroneous wiring of an interconnect device in order to prevent a safety fuse from being melted and quickly perform an overcurrent protection in the event of erroneous wiring or the like. In this connection circuit of the interconnect device, a preliminary wiring check operation is performed when a power control unit receives a power-on signal. It is detected whether or not a power line and a ground line are short-circuited in the preliminary wiring check operation. When the power line and the ground line are not short-circuited, an operation instruction is output from the power control unit to a power unit. As a result, power is turned on after it is checked whether or not the power line and the ground line are short-circuited in advance. Therefore, it is possible to prevent the safety fuse from being melted.

4 Claims, 5 Drawing Sheets

(56) References Cited

U.S. PATENT DOCUMENTS

| | | | |
|---|---|---|---|
| 2005/0017726 A1* | 1/2005 | Koran | G01R 31/007 324/433 |
| 2007/0001683 A1* | 1/2007 | Krigel | G01R 31/021 324/503 |
| 2017/0102425 A1* | 4/2017 | Hao | G01R 31/346 |

FOREIGN PATENT DOCUMENTS

| | | |
|---|---|---|
| JP | 2000105616 A | 4/2000 |
| JP | 2002170444 A | 6/2002 |
| JP | 2003-189467 A | 7/2003 |
| JP | 2006054833 A | 2/2006 |
| JP | 2013032946 A | 2/2013 |

\* cited by examiner

<RELATED ART>

FIG.5

CONNECTION CIRCUIT OF INTERCONNECT DEVICE

CROSS-REFERENCE TO THE RELATED APPLICATIONS

This application is a new U.S. Patent Application that claims benefit of Japanese Patent Application No. 2017-034830, filed Feb. 27, 2017,the disclosure of this application is being incorporated herein by reference in its entirety for all purposes.

BACKGROUND OF THE INVENTION

1. Field of the Invention

The present invention relates to a connection circuit of an interconnect device, and more particularly, to a connection circuit capable of detecting erroneous wiring in an interconnect device.

2. Description of the Related Art

Figure 4:
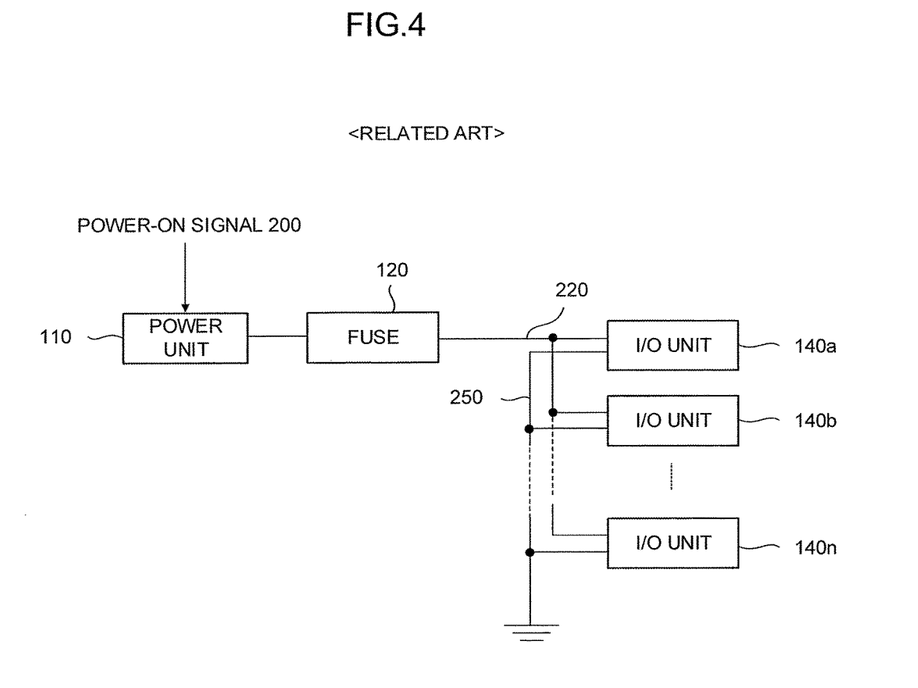
FIG. 4 is a diagram illustrating a connection circuit of an interconnect device of the related art.

In some cases, a peripheral device is connected to an interface for connecting the peripheral device when a machining tool is used. FIG. 4 is a diagram illustrating a connection circuit of an interconnect device of the related art. A plurality of I/O units 140 are connected to a power unit 110 through a power line 220, and a safety fuse 120 is connected between the power unit 110 and each I/O unit 140. In addition, each I/O unit 140 is grounded through a ground line 250.

In wiring having such a configuration, when an operator connects the I/O unit 140 of the peripheral device, in some cases, the power line 220 and the ground line 250 may be short-circuited due to erroneous wiring, a defect in a connection cable, or the like. If a power-on signal 200 is input to the power unit 110 in this state, the safety fuse 120 may be melted due to the short-circuit state.

In this case, if it is obvious that the power line 220 and the ground line 250 are short-circuited, the short-circuit state can be addressed. However, if the short-circuit state is unknown, an operator may think it as an erroneous operation of a machine, and turn on the power again or change the wiring and then turn on the power again. In this case, since the power is turned on again while an actual short circuit state is not addressed, the safety fuse 120 may be melted again.

Figure 5:
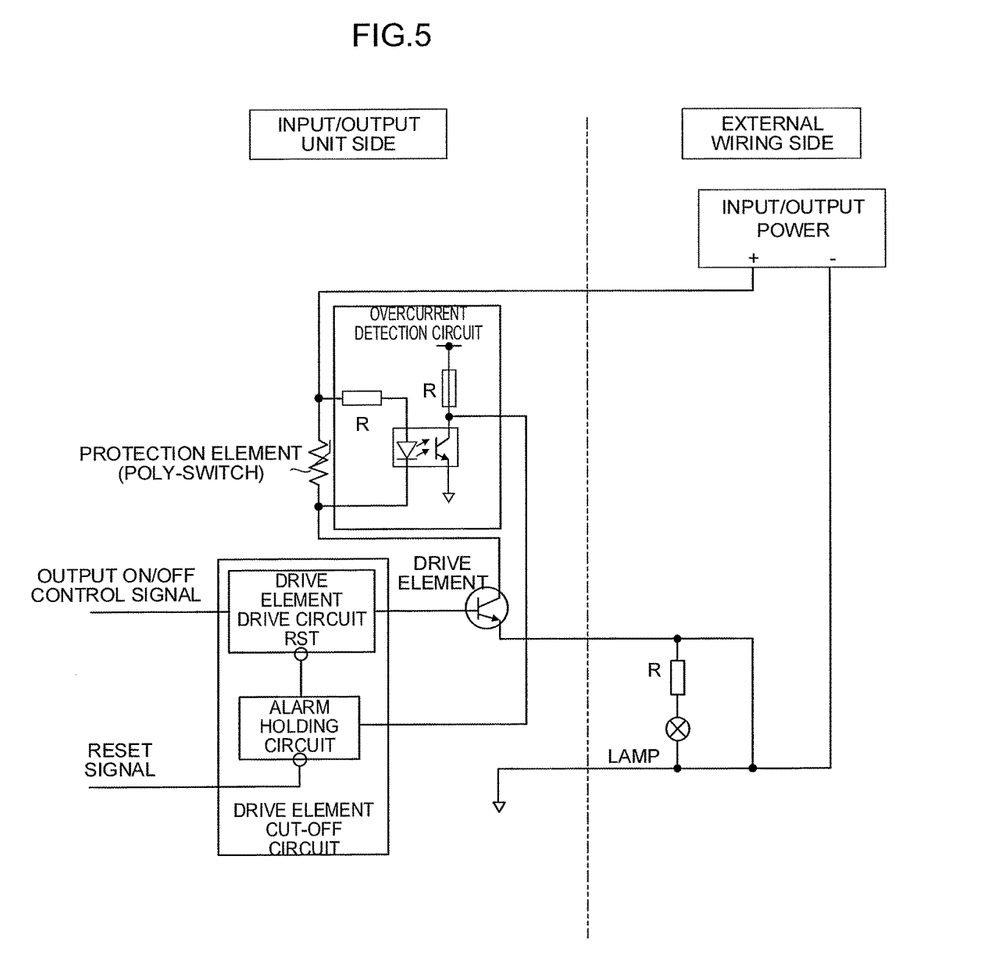
FIG. 5 is a diagram illustrating a connection circuit of an interconnect device of the related art.

Japanese Patent Application Laid-Open No. 2003-189467 discloses a technique of using a poly-switch which is an element having an increasing resistance when an overcurrent flows instead of the safety fuse in order to prevent the safety fuse from being repeatedly replaced in the event of a wiring error (see FIG. 5). The poly-switch cuts off the current using heat generated in the event of an overcurrent. However, its temperature decreases to a predetermined level, so that the connection state is recovered. For this reason, it is not necessary to replace the safety fuse even when an overcurrent occurs.

In the example of FIG. 4, since the safety fuse is inserted into the wiring, the safety fuse is melted when an overcurrent occurs. In order to prevent such a disadvantage, the power may be turned on by checking the wiring again using a conduction tester before the power-on operation. However, in this method, it is required to separately prepare the conduction tester and individually check the wires one by one using the conduction tester. This is a cumbersome work.

In the technique discussed in Japanese Patent Application Laid-Open No. 2003-189467, replacement of the safety fuse caused by the melting in the event of an overcurrent is not necessary because the poly-switch is employed. However, the poly-switch is an element for a low current of milliamperes. Therefore, compared to the safety fuse, a cut-off time is necessary when the poly-switch is employed in a circuit having a normal current of several amperes. In this case, it may be difficult to protect the circuit from the overcurrent.

SUMMARY OF THE INVENTION

In this regard, it is an object of the invention to provide a connection circuit capable of detecting erroneous wiring of an interconnect device in order to prevent the safety fuse from being melted and quickly perform an overcurrent protection in the event of erroneous wiring or the like.

According to an aspect of the invention, there is provided a connection circuit of an interconnect device, including: at least one interface for connecting the interconnect device; at least one power unit for supplying power to the interface through a power line; at least one safety fuse provided between the power unit and the interface; at least one ground line for grounding the interface; and a power control unit configured to perform an output control to the power unit, in which a preliminary wiring check operation is performed as the power control unit receives a power-on signal, it is detected whether or not the power line and the ground line are short-circuited on the basis of the preliminary wiring check operation, and a power output control signal is output from the power control unit to the power unit when the power line and the ground line are not short-circuited.

In this aspect of the invention, it is detected whether or not the power line and the ground line are short-circuited after the power-on signal is received by the power control unit. Then, when it is checked that the power line and the ground line are not short-circuited, power is supplied from the power control unit by operating the power unit. Therefore, it is possible to prevent the safety fuse from being melted due to an overcurrent caused by erroneous wiring or the like.

In this aspect of the invention, the connection circuit of the interconnect device described above may further include a short-circuit checker configured to detect a short circuit between the power line and the ground line, in which, in the preliminary wiring check operation, the power control unit transmits, to the short-circuit checker, a wiring check request signal for checking whether or not the power line and the ground line are short-circuited, and the short-circuit checker transmits a wiring normality signal to the power control unit when the power line and the ground line are not short-circuited.

The connection circuit of the interconnect device according to this aspect of the invention may further include a short-circuit checker configured to detect a short circuit between the power line and the ground line. In the preliminary wiring check operation performed after the power-on signal is received by the power control unit, the short-circuit checker checks whether or not the power line and the ground line are short-circuited. When they are not short-circuited, power is supplied from the power control unit by operating the power unit. Therefore, until it is checked that the power line and the ground line are not short-circuited, power is not supplied from the power unit to the interconnect device. As a result, it is possible to prevent the safety fuse from being melted due to an overcurrent caused by erroneous wiring or the like.

In this aspect of the invention, the connection circuit of the interconnect device may further include an amperemeter provided between the safety fuse and the interface, in which, in the preliminary wiring check operation, the power control unit instructs that the power unit is supplied with power of a current smaller than that of a normal operation, the power unit supplies power of a current smaller than that of a normal operation to the interface on the basis of the instruction from the power control unit, and it is determined that the power line and the ground line are not short-circuited when the amperemeter detects a current value smaller than a threshold value.

The connection circuit of the interconnect device according to the aspect of the invention described above may further include an amperemeter between the safety fuse and the interface. Power of a current smaller than that of a normal operation is supplied to the power unit in the preliminary wiring check operation performed after the power-on signal is received by the power control unit. It is determined that the power line and the ground line are not short-circuited when the amperemeter detects a current value smaller than the threshold value, so that power is supplied from the power unit to the interconnect device. Therefore, it is possible to prevent an excessive current flow and melting of the safety fuse even when a short circuit occurs due to erroneous wiring or the like.

In the connection circuit of the interconnect device according to the aspect of the invention described above, a plurality of sets of the power unit, the safety fuse, and the interface connected through the power line may be provided. It is detected whether or not the power line and the ground line are short-circuited and where a short circuit occurs in the event of the short circuit by detecting the short circuit between the power line and the ground line sequentially in the plurality of sets in the preliminary wiring check operation.

In the connection circuit of the interconnect device according to the aspect of the invention described above, a short circuit in a plurality of sets of the power unit, the safety fuse, and the interface is sequentially detected in the preliminary wiring check operation. Therefore, it is possible to detect whether or not a short circuit occurs and where the short circuit occurs in the power unit, the safety fuse, and the interface in the event of the short circuit.

According to this invention, it is possible to provide a connection circuit capable of detecting erroneous wiring in the interconnect device in order to prevent melting of the safety fuse and quickly perform an overcurrent protection in the event of erroneous wiring or the like.

BRIEF DESCRIPTION OF THE DRAWINGS

The foregoing and other objects and features of the invention will become apparent from the following description of embodiments with reference to the accompanying drawings.

DETAILED DESCRIPTION OF THE PREFERRED EMBODIMENTS

Embodiments of the invention will now be described with reference to the accompanying drawings.
(First Embodiment)

Figure 1:
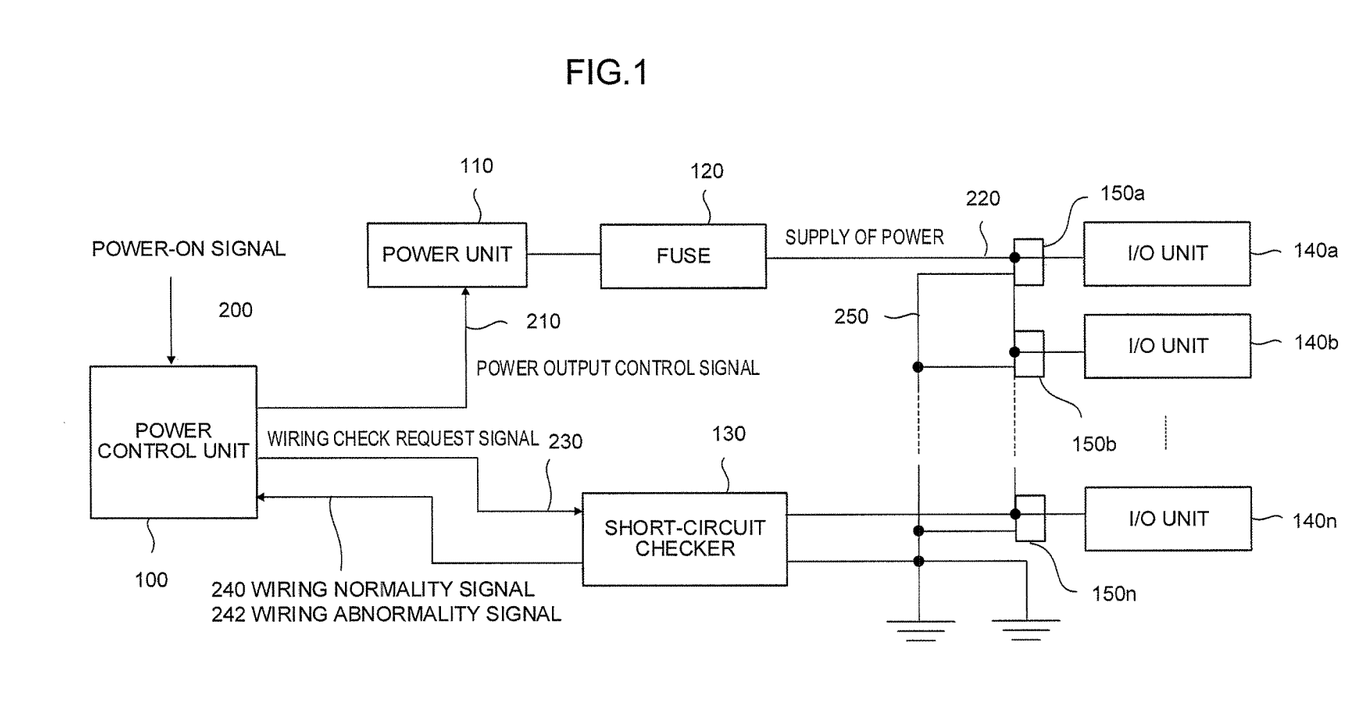
FIG. 1 is a diagram illustrating an exemplary connection circuit of an I/O unit according to an embodiment of the invention.

FIG. 1 is a diagram illustrating an exemplary connection circuit of an I/O unit according to this embodiment. A power control unit 100 has a configuration capable of externally receiving a power-on signal 200. In addition, the power control unit 100, a power unit 110, a safety fuse 120, and each interface 150 are connected to each other through a power line 220. The power control unit 100 is connected to the power unit 110, and the power unit 110 is connected to each interface 150 via the safety fuse 120. In addition, each interface 150 is connected to each I/O unit 140.

Each interface 150 is connected to each ground line 250 and is grounded through the ground line 250. In addition, the power control unit 100 is connected to a short-circuit checker 130. In addition, the short-circuit checker 130 is connected to the power line 220 and the ground line 250.

Next, operations according to this embodiment will be described. As the power-on signal 200 is input to the power control unit 100, the power control unit 100 first outputs a wiring check request signal 230 to the short-circuit checker 130 without directly outputting a power output control signal 210 to the power unit 110. The short-circuit checker 130 that receives the wiring check request signal 230 checks whether or not the power line 220 and the ground line 250 are short-circuited. As a check method, similar to the short-circuit check method using a conduction tester, a terminal makes contact with the power line 220 and the ground line 250 to check conduction therebetween.

In the short-circuit checker 130, when it is checked that the power line 220 and the ground line 250 are not conducted and short-circuited with each other, a wiring normality signal 240 is output to the power control unit 100. Meanwhile, when it is checked that the power line 220 and the ground line 250 are conducted and short-circuited with each other, a wiring abnormality signal 242 is output to the power control unit 100.

When the power control unit 100 receives the wiring abnormality signal 242 from the short-circuit checker 130, it is determined that a short circuit occurs between the power line 220 and the ground line 250, and the power output control signal 210 is not output to the power unit 110. In addition, in this case, a fact that abnormality occurs in the wiring may be notified. Meanwhile, when the power control unit 100 receives the wiring normality signal 240 from the short-circuit checker 130, the power output control signal 210 is output from the power control unit 100 to the power unit 110.

When the power unit 110 receives the power output control signal from the power control unit 100, power is supplied to each interface 150 via the safety fuse 120 and the power line 220. In this case, since the short-circuit checker 130 has already checked that a short circuit does not occur between the power line 220 and the ground line 250, even by supplying power to each interface 150, an overcurrent does not flow to the safety fuse 120 and the safety fuse 120 is not melted.

Figure 2:
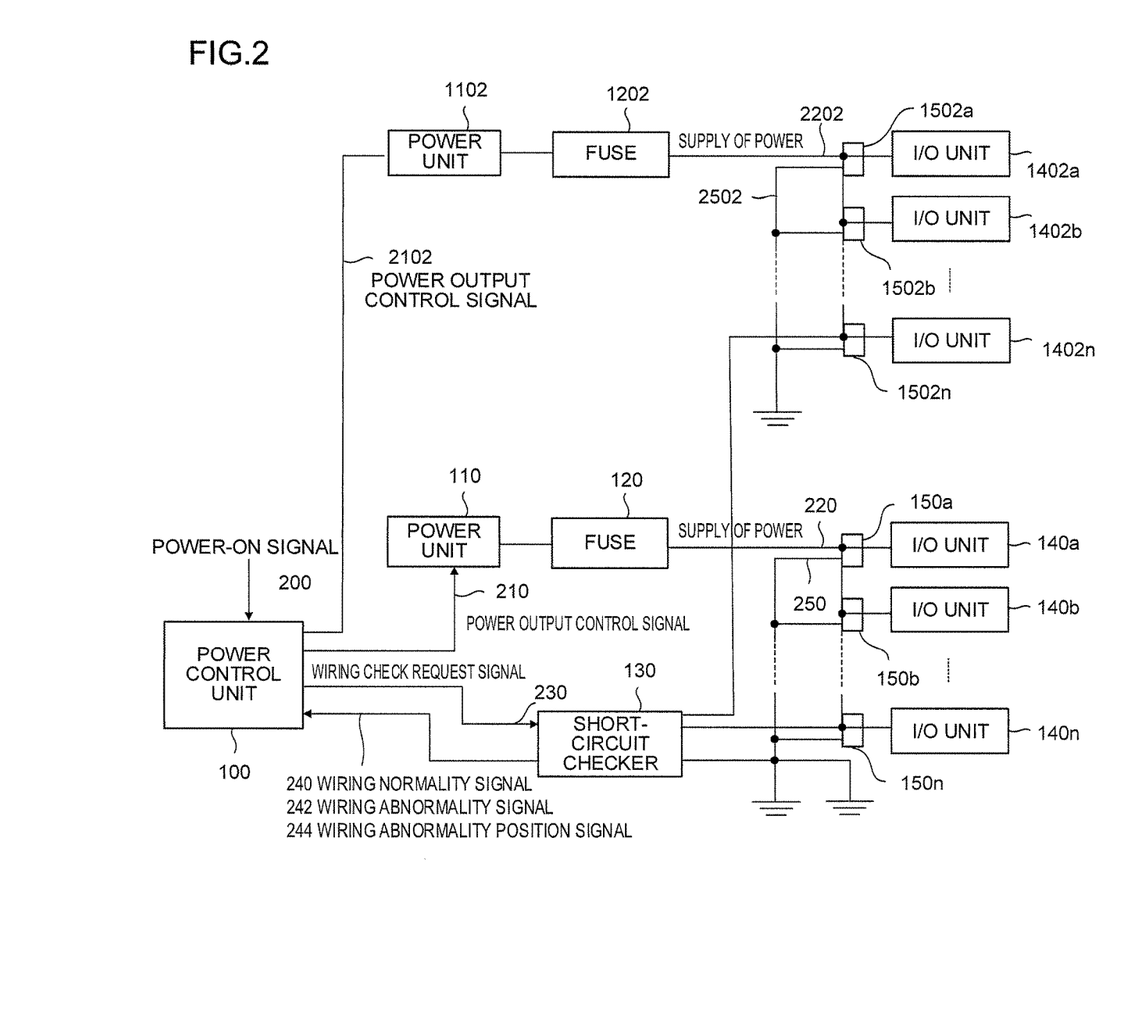
FIG. 2 is a diagram illustrating an exemplary connection circuit of an I/O unit according to a modification of the invention.

FIG. 2 is a diagram illustrating a modification of this embodiment. In this modification, a plurality of sets of the power unit, the safety fuse, and the I/O unit are provided, and the power units 110 and 1102 of the power control unit 100 are connected to the safety fuses 120 and 1202, respectively. In addition, as the power-on signal 200 is input to the power control unit 100, the power control unit 100 first outputs the wiring check request signal 230 to the short-circuit checker 130 without directly outputting the power output control signal 210 to respective power units 110 and 1102. The short-circuit checker 130 that receives the wiring check request signal 230 checks whether or not the power lines 220 and 2202 and the ground lines 250 and 2502 that connect the power units 110 and 1102, the safety fuses 120 and 1202, and respective I/O units 140 and 1402 to each other are short-circuited while switching a connection destination using a changeover switch (not illustrated). As a method for this check, similar to the short circuit check using the conduction tester, a terminal makes contact with the power line 220 and the ground line 250 to check conduction therebetween.

When the short-circuit checker 130 checks that the power lines 220 and 2202 and the ground lines 250 and 2502 are not conducted and short-circuited with each other, the wiring normality signal 240 is output to the power control unit 100. Meanwhile, when it is checked that the power lines 220 and 2202 and the ground lines 250 and 2502 are conducted and short-circuited with each other, the wiring abnormality signal 242 and the wiring abnormality position signal 244 are output to the power control unit 100.

When the power control unit 100 receives the wiring abnormality signal 242 from the short-circuit checker, 130, it is determined that a short circuit occurs between the power lines 220 and 2202 and the ground lines 250 and 2502, and the power output control signal 210 is not output to the power unit 110. In addition, a fact that abnormality occurs in the wiring may be notified, or whether or not wiring abnormality occurs in any position may be notified using information from the wiring abnormality position signal 244. Meanwhile, when the power control unit 100 receives the wiring normality signal 240 from the short-circuit checker 130, the power output control signal 210 is output from the power control unit 100 to the power unit 110.

When the power unit 110 receives the power output control signal from the power control unit 100, power is supplied to respective interfaces 150 and 1502 via the safety fuses 120 and 1202 and the power line 220. In this case, since the short-circuit checker 130 has already checked that a short circuit does not occur between the power lines 220 and 2202 and the ground lines 250 and 2502, even by supplying power to respective interfaces 150 and 1502, an overcurrent does not flow to the safety fuses 120 and 1202 and the safety fuses 120 and 1202 are not melted.

Note that, although two sets of the power unit, the safety fuse, and the I/O unit have been described in this modification by way of example, three or more sets may be provided to perform the check while switching the connection destination using a changeover switch (not illustrated).

(Second Embodiment)

Figure 3:
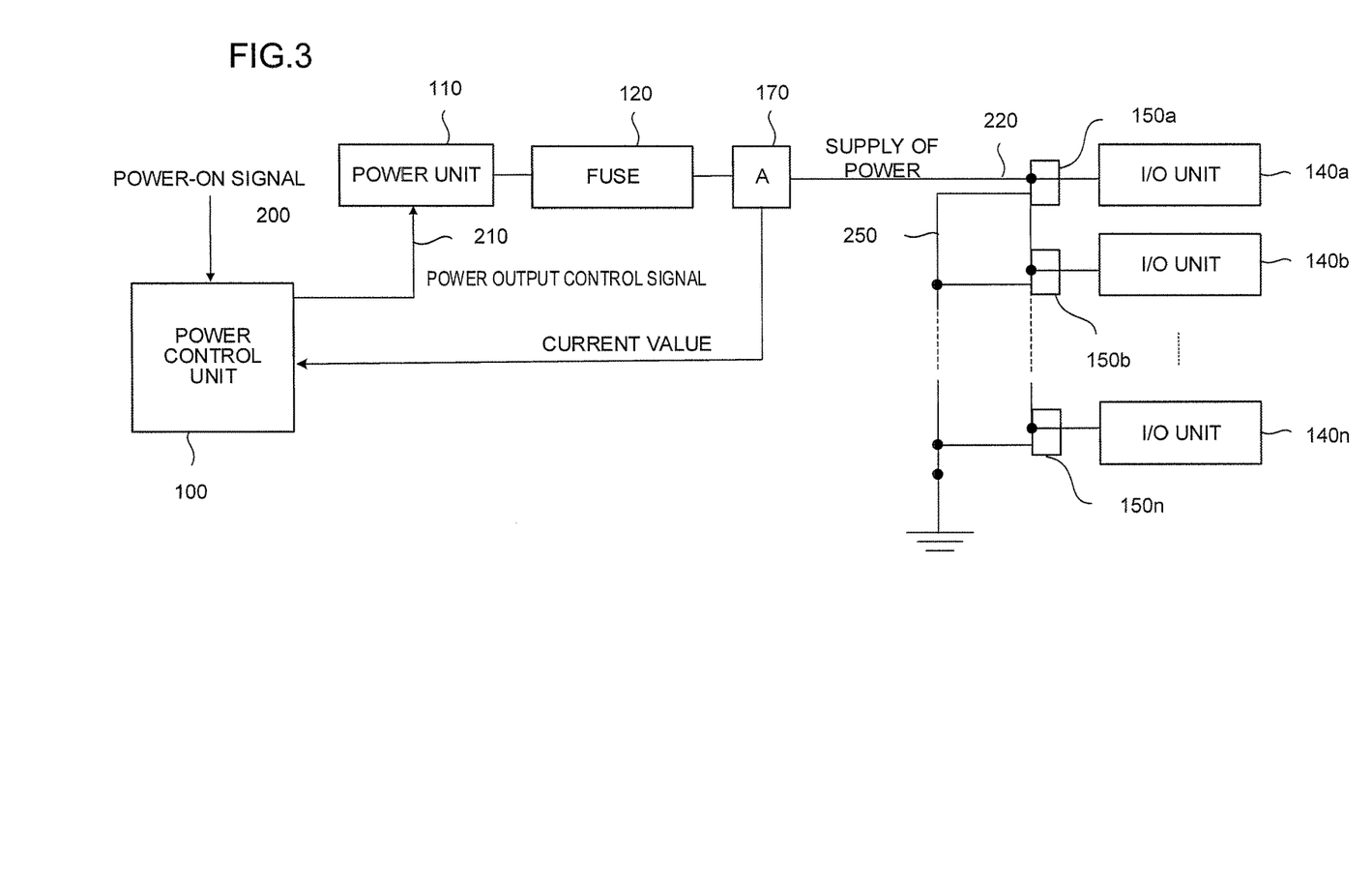
FIG. 3 is a diagram illustrating an exemplary connection circuit of an I/O unit according to another embodiment of the invention.

FIG. 3 is a diagram illustrating an exemplary connection circuit of the I/O unit according to this embodiment. The power control unit 100 can externally receive the power-on signal 200. In addition, the power control unit 100, the power unit 110, the safety fuse 120, an amperemeter 170, and each interface 150 are connected to each other through the power line 220. Furthermore, the power control unit 100 is connected to the power unit 110, and the power unit 110 is connected to each interface 150 via the safety fuse 120 and the amperemeter 170. In addition, each interface 150 is connected to each I/O unit 140. Each interface 150 is connected to each ground line 250 and is grounded through the ground line 250.

Next, operations according to this embodiment will be described. As the power-on signal 200 is input to the power control unit 100, the power control unit 100 first supplies power of a very small current to the power unit 110 without directly outputting a typical power output control signal 210 to the power unit 110, so that the power unit 110 supplies power of a very small current to each I/O unit 140 via the safety fuse 120 and the amperemeter 170.

Then, the amperemeter 170 measures the current amount flowing through the power line 220 and outputs the current amount to the power control unit. When the current amount measured and output from the amperemeter 170 is larger than a threshold value set in advance, the power control unit 100 determines that the power line 220 and the ground line 250 are short-circuited with each other. Meanwhile, when the current amount measured and output from the amperemeter 170 is equal to or smaller than the threshold value set in advance, the power control unit 100 determines that the power line 220 and the ground line 250 are not short-circuited, and have a normal state.

When it is determined that the current amount output from the amperemeter 170 is larger than the threshold value set in advance and the power line 220 and the ground line 250 are short-circuited, the power control unit 100 does not output the power output control signal 210 for this operation to the power unit 110. Meanwhile, when it is determined that the power line 220 and the ground line 250 are not short-circuited, the power output control signal 210 for this operation is output from the power control unit 100 to the power unit 110, and this operation is executed, so that power is supplied to each interface 150 via the safety fuse 120 and the power line 220.

In this case, the current amount is measured using the amperemeter 170 by supplying power of a very small current in advance to check whether or not a short circuit occurs between the power line 220 and the ground line 250. Therefore, even by supplying power to each interface 150, an overcurrent does not flow to the safety fuse 120 and the safety fuse 120 is not melted.

Similar to the modification of the first embodiment, in the second embodiment, a plurality of sets of the power unit, the safety fuse, and each I/O unit may be provided. In addition, the power control unit 100 is applicable by providing the amperemeter 170 between the safety fuse 120 and the I/O unit 140 even when the safety fuse is connected to each power unit.

While the embodiments of the invention have been described hereinbefore, other aspects may be possible by appropriately changing them without limiting thereto.

The invention claimed is:

1. A connection circuit of an interconnect device, comprising:
   at least one interface for connecting to the interconnect device of an electrical load;
   at least one power unit for supplying power to the interface through a power line;
   at least one safety fuse provided between the power unit and the interface;
   at least one ground line for grounding the interface; and
   a power control unit configured to perform an output control to the power unit,
   wherein when the power control unit receives a power-on signal, a preliminary wiring check operation is performed by:
      preventing the power unit from supplying power to the interface through the power line, and determining whether or not the power line and the ground line are short-circuited, wherein when it is determined during the preliminary wiring check operation that the power line and the ground line are not short-circuited, a power output control signal is output from the power control unit to the power unit which instructs the power unit to supply power to the interface through the power line.

2. The connection circuit of the interconnect device according to claim 1, further comprising a short-circuit checker configured to detect a short circuit between the power line and the ground line, wherein, in the preliminary wiring check operation, the power control unit transmits, to the short-circuit checker, a wiring check request signal for checking whether or not the power line and the ground line are short-circuited, and the short-circuit checker transmits a wiring normality signal to the power control unit when the power line and the ground line are not short-circuited.

3. The connection circuit of the interconnect device according to claim 1, further comprising an amperemeter provided between the safety fuse and the interface, wherein, in the preliminary wiring check operation, the power control unit instructs that the power unit is supplied with power of a current smaller than that of a normal operation, the power unit supplies power of a current smaller than that of a normal operation to the interface on the basis of the instruction from the power control unit, and it is determined that the power line and the ground line are not short-circuited when the amperemeter detects a current value smaller than a threshold value.

4. The connection circuit of the interconnect device according to claim 1, wherein a plurality of sets of the power unit, the safety fuse, and the interface connected through the power line are provided, it is detected whether or not the power line and the ground line are short-circuited and where the short circuit occurs in the event of a short circuit by detecting a short circuit between the power line and the ground line sequentially in the plurality of sets in the preliminary wiring check operation.

* * * * *